United States Patent
Song et al.

(10) Patent No.: US 10,113,082 B2
(45) Date of Patent: Oct. 30, 2018

(54) UV CURABLE INTERLAYER COMPOSITION FOR PRINTED ELECTRONICS APPLICATION

(71) Applicant: Xerox Corporation, Norwalk, CT (US)

(72) Inventors: Guiqin Song, Milton (CA); Naveen Chopra, Oakville (CA); Nan-Xing Hu, Oakville (CA); Biby Esther Abraham, Mississauga (CA); Michelle N Chretien, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 66 days.

(21) Appl. No.: 15/268,786

(22) Filed: Sep. 19, 2016

(65) Prior Publication Data

US 2018/0079926 A1  Mar. 22, 2018

(51) Int. Cl.

| | |
|---|---|
| C08F 2/48 | (2006.01) |
| C09D 175/16 | (2006.01) |
| B29C 35/02 | (2006.01) |
| B41M 5/00 | (2006.01) |
| C09D 133/08 | (2006.01) |
| B05D 3/06 | (2006.01) |
| B05D 7/00 | (2006.01) |
| C08K 3/08 | (2006.01) |
| C09D 11/52 | (2014.01) |
| C09D 133/14 | (2006.01) |
| C09D 135/02 | (2006.01) |
| C09D 4/00 | (2006.01) |
| C09D 5/00 | (2006.01) |
| H05K 3/38 | (2006.01) |
| C08F 2/38 | (2006.01) |
| H05K 1/09 | (2006.01) |
| H05K 3/12 | (2006.01) |
| C08F 220/28 | (2006.01) |
| C08F 222/10 | (2006.01) |

(52) U.S. Cl.

CPC ........... *C09D 133/08* (2013.01); *B05D 3/067* (2013.01); *B05D 7/50* (2013.01); *C08F 2/38* (2013.01); *C08K 3/08* (2013.01); *C09D 4/00* (2013.01); *C09D 5/002* (2013.01); *C09D 11/52* (2013.01); *C09D 133/14* (2013.01); *C09D 135/02* (2013.01); *H05K 3/386* (2013.01); *C08F 2220/281* (2013.01); *C08F 2220/282* (2013.01); *C08F 2222/1013* (2013.01); *C08K 2003/0806* (2013.01); *C08K 2201/001* (2013.01); *C08K 2201/005* (2013.01); *C08K 2201/011* (2013.01); *H05K 1/097* (2013.01); *H05K 3/1208* (2013.01)

(58) Field of Classification Search
CPC ........ C08L 33/10; C08L 33/14; C08L 33/066; C08F 220/06; C08F 220/18; C08K 5/00; C09D 133/14; B29C 35/04; H05K 1/185; H05K 3/287; H05K 2201/0209; H05K 2201/101288; Y10T 428/31609
USPC .................. 428/425.9; 264/402, 428; 522/96
See application file for complete search history.

(56) References Cited

U.S. PATENT DOCUMENTS

| | | | |
|---|---|---|---|
| 4,234,676 A | 11/1980 | Hein et al. | |
| 4,891,152 A * | 1/1990 | Miller | C09K 19/544 252/299.01 |
| 5,867,238 A * | 2/1999 | Miller | G02F 1/1333 349/86 |
| 6,265,476 B1 * | 7/2001 | Krongauz | C08F 290/067 385/123 |
| 6,506,814 B2 | 1/2003 | Krongauz et al. | |
| 2005/0181566 A1* | 8/2005 | Machida | H01L 29/66757 438/301 |
| 2010/0261018 A1* | 10/2010 | Turshani | B32B 7/12 428/414 |

FOREIGN PATENT DOCUMENTS

WO    WO2009010423    1/2009

OTHER PUBLICATIONS

Hoyle et al., Thiol-Enes: Fast Curing Systems with Exceptional Properties, RadTech Europe 2005 Conference & Exhibition, 2005.

* cited by examiner

*Primary Examiner* — Thao T Tran

(57) ABSTRACT

UV-curable interlayer compositions are provided. An interlayer composition may contain a polyallyl isocyanurate compound, an ester of β-mercaptopropionic acid, a monofunctional (meth)acrylate monomer having one or more cyclic groups, and a photoinitiator. Processes of using the interlayer compositions to form multilayer structures and the multilayer structures are also provided.

17 Claims, No Drawings

UV CURABLE INTERLAYER COMPOSITION FOR PRINTED ELECTRONICS APPLICATION

BACKGROUND

Solution-processable conductive inks, including metal nanoparticle inks, are of great interest for fabricating the electronic circuit elements (e.g., electrodes, pixel pads, and conductive traces, lines and tracks) of a variety of electronic devices (e.g., thin film transistors (TFTs), light-emitting diodes (LEDs), radio-frequency identification (RFID) tags, and photovoltaics). Silver nanoparticle inks are a promising class of materials for printed electronics. In this regard, fabrication of electronic circuit elements using silver nanoparticle inks has been described in, for example, U.S. Pat. Nos. 8,765,025; 8,361,350; 8,324,294; 8,298,314; 8,158,032; 8,057,849; and 7,270,694, each of which is hereby incorporated by reference in its entirety. Some issues encountered with printing metal nanoparticle inks include poor ink wetting on an underlying substrate, rough or uneven surfaces of the underlying substrate, reduction or loss of the conductivity of inks upon printing, and poor adhesion of inks to the underlying substrate. These issues have been previously addressed by adjusting the composition of the metal nanoparticle inks and/or the use of thermally curable interlayer compositions. Thermally curable interlayer compositions typically require organic solvents, high curing temperatures (e.g., from about 100° C. to about 160° C.) and long curing times (e.g., from about 0.5 hours to about 6 hours).

SUMMARY

The present disclosure, which enables curing at lower temperatures or for less time or both, accordingly provides illustrative examples of interlayer compositions, interlayer films, and multilayer structures containing these interlayer films, as well as associated methods of producing these interlayer compositions and films, and their assembled multilayer structures.

In one aspect, UV-curable interlayer compositions are provided. In embodiments, a UV-curable interlayer composition contains a polyallyl isocyanurate compound, an ester of β-mercaptopropionic acid, a monofunctional (meth)acrylate monomer having one or more cyclic groups, and a photoinitiator.

In another aspect, multilayer structures are provided. In embodiments, a multilayer structure includes a substrate, an interlayer film on the substrate, and a conductive layer on the interlayer film, the conductive layer comprising sintered metal nanoparticles. The interlayer film is formed from an interlayer composition containing a polyallyl isocyanurate compound, an ester of β-mercaptopropionic acid, a (meth) acrylate monomer, and a photoinitiator.

In another aspect, processes of forming a multilayer structure are provided. In embodiments, the process includes depositing a UV-curable interlayer composition on a substrate, exposing the deposited interlayer composition to UV light under conditions sufficient to cure the interlayer composition to form a cured interlayer film, depositing a conductive composition comprising metal nanoparticles on the cured interlayer film, and annealing the conductive composition to produce a conductive layer comprising sintered metal nanoparticles. The interlayer composition contains a polyallyl isocyanurate compound, an ester of β-mercaptopropionic acid, a (meth)acrylate monomer, and a photoinitiator.

DETAILED DESCRIPTION

The present disclosure provides interlayer compositions, interlayer films, multilayer structures containing the interlayer films, and related methods. The interlayer compositions are curable using ultraviolet (UV) light to provide the interlayer films. In embodiments, the interlayer films are produced more efficiently (e.g., less than a minute) under conditions (e.g., room temperature) which are more compatible with processing techniques for electronic devices (e.g., ink jet printing), by contrast to thermally curable interlayer compositions. Moreover, in embodiments, the interlayer compositions can be cured in an ambient atmosphere (i.e., air) without exhibiting curing problems due to oxygen inhibition. Moreover, in embodiments, the interlayer films exhibit excellent wettability for conductive inks (e.g., those containing silver nanoparticles), enabling the printing of fine features (e.g., lines with sharp edges and uniform, micron-sized widths). In embodiments, the interlayer films also provide excellent adhesion of the conductive layers to an underlying substrate (e.g., polycarbonate, glass or a flexible polymeric substrate such as polyethylene terephthalate (PET), polyethylene-naphthalate (PEN) or polyimide (Kapton) films).

Interlayer Composition

In embodiments, the interlayer composition contains a polyallyl isocyanurate compound, a mercaptoester compound, a (meth)acrylate monomer, and a photoinitiator. The polyallyl isocyanurate compound and the mercaptoester compound may be provided together in the form of a blend, i.e., a pre-made mixture. The photoinitiator may be included as part of this blend.

Polyallyl Isocyanurate Compound

The interlayer composition contains a polyallyl isocyanurate compound. By "polyallyl" it is meant that the compound has two or more (e.g., three) allyl groups. A variety of polyallyl isocyanurate compounds may be used, provided the compound is capable of undergoing free-radical polymerization reactions with the selected mercaptoester compound(s) to form a crosslinked polymer. Illustrative suitable polyallyl isocyanurate compounds include 1,3,5-triallyl-1,3,5-triazine-2,4,6(1H,3H,5H)-trione and 2,4,6-triallyloxy-1,3,5-triazine. A single type of polyallyl isocyanurate compound or multiple types of polyallyl isocyanurate compounds may be used. In embodiments, the polyallyl isocyanurate compound is not a polymeric or an oligomeric compound

Mercaptoester Compound

The interlayer composition further contains one or more types of mercaptoester compounds. A variety of mercaptoester compounds may be used, including esters of β-mercaptopropionic acid. Such esters of β-mercaptopropionic acid include those with a single thiol group (monothiol mercaptoester compounds) and those with multiple thiol groups (polythiol mercaptoester compounds). For example, esters of β-mercaptopropionic acid and monohydroxy compounds (e.g., alcohols) may be used. Illustrative monothiol mercaptoester compounds include alkyl 3-mercaptopropionates such as methyl 3-mercaptopropionate, ethyl 3-mercaptopropionate, butyl 3-mercaptopropionate, and the like. The alkyl group may have a number of carbons in the range from, e.g., 1 to 6, e.g., methyl 3-mercaptopropionate, ethyl 3-mercaptopropionate, butyl 3-mercaptopropionate, and the like. As another example, esters of β-mercaptopropionic acid and polyhydroxy compounds (e.g., glycols, triols, tetrols, pentahydroxy, hexahydroxy, etc.) may be used. Esters of β-mercaptopropionic acid and pentaerythritol may be used. Esters of β-mercaptopropionic acid and dipentaerythritol may be used. Illustrative polythiol mercaptoester compounds include trimethylolpropane tris(3-mercaptopropionate), pentaerythritol tetrakis(3-mercaptopropionate), ethylene glycol bis(3-mercaptopropionate), dipentaerythritol hexakis(3-mercaptopropionate), and the like. Other polythiol mercaptoester compounds which may be used include those disclosed in International Publication No. WO2009/010423, which is hereby incorporated by reference for its disclosure of polythiol mercaptoester compounds. An illustrative polythiol mercaptoester compound is Polythiol QE-340M, available from Toray Industries. However, in embodiments, the mercaptoester compound is not a polymeric or an oligomeric compound.

The interlayer composition may include one or more types of monothiol mercaptoester compounds and one or more types of polythiol mercaptoester compounds. However, the interlayer composition may include only polythiol mercaptoester compounds (e.g., trimethylolpropane tris(3-mercaptopropionate), pentaerythritol tetrakis(3-mercaptopropionate), or a combination thereof).

The polyallyl isocyanurate compound(s) and the mercaptoester compound(s) may be included in the interlayer composition in various suitable amounts. The amount of each and the weight ratio of the amounts may depend, at least in part, upon the desired viscosity of the interlayer composition, as further described below. In addition, the amount of polyallyl isocyanurate compound(s) may depend upon the selected mercaptoester compound(s) (e.g., mercaptoester compounds with six thiol groups may require more polyallyl isocyanurate compound in the mercaptoester composition; mercaptoester compounds with three thiol groups may require less polyallyl isocyanurate compound). In embodiments, the polyallyl isocyanurate compound(s) are present in an amount of from about 10% to about 40% by weight of the interlayer composition, from about 15% to about 35% by weight of the interlayer composition, or from about 20% to about 30% by weight of the interlayer composition. In embodiments, the mercaptoester compound(s) are present in an amount of from about 1% to about 30% by weight of the interlayer composition, from about 5% to about 25% by weight of the interlayer composition, or from about 10% to about 20% by weight of the interlayer composition.

The polyallyl isocyanurate compound(s) and the mercaptoester compound(s) may be provided in the interlayer composition in the form of a blend. In embodiments, the polyallyl isocyanurate compound(s) are present in an amount of from about 45% to about 70% by weight of the blend, from about 55% to about 70% by weight of the blend, or from about 60% to about 65% by weight of the blend. In embodiments, the mercaptoester compound(s) are present in an amount of from about 30% to about 55% by weight of the blend, from about 30% to about 50% by weight of the blend, from about 30% to about 45% by weight of the blend, or from about 30% to about 40% by weight of the blend.

Optionally, the blend may further contain one or more types of a photoinitiator. Any of the photoinitiators described below may be used in any of the amounts described below (except that "by weight" refers to the weight of the blend). Alternatively, the photoinitiator(s) may be separately added to the interlayer composition.

In embodiments, the blend consists or consists essentially of one or more types of polyallyl isocyanurate compounds (e.g., one), one or more types of mercaptoester compounds (e.g., two); and optionally, one or more types of photoinitiators (e.g., one).

An illustrative blend is Norland Optical Adhesive 83H, available from Norland Products, Inc.

When the polyallyl isocyanurate compound(s) and the mercaptoester compound(s) are provided in the interlayer composition as a blend, the blend may be included in the interlayer composition in various suitable amounts. In embodiments, the blend is present in an amount of from about 30% to about 85% by weight of the interlayer composition, from about 40% to about 80% by weight of the interlayer composition, from about 55% to about 65% by weight of the interlayer composition, or from about 50% to about 60% by weight of the interlayer composition.

(Meth)Acrylate Monomer

A variety of (meth)acrylate monomers may be used. As used throughout this specification the term "(meth)acrylate" encompasses both methacrylate and acrylate compounds. In embodiments, the interlayer composition contains a single type of (meth)acrylate monomer. In other embodiments, the interlayer composition contains more than one type of (meth)acrylate monomer, e.g., two types or three types. In embodiments, the (meth)acrylate monomer is monofunctional.

In embodiments, the (meth)acrylate monomer includes one or more cyclic groups. The use of (meth)acrylate monomers having one or more cyclic groups may provide the interlayer film with desirable mechanical properties such as reduced shrinkage and increased toughness due to the reduced amount of dimensional changes during curing. The cyclic group may be a cyclic alkyl group in which the number of carbons may range from, e.g., 2 to 10, 2 to 8, 2 to 6, etc. The cyclic alkyl group may be unsubstituted, by which it is meant the cyclic alkyl group contains no heteroatoms. The cyclic alkyl group may be substituted, by which it is meant an unsubstituted cyclic alkyl group in which one or more bonds to a carbon(s) or hydrogen(s) are replaced by a bond to non-hydrogen and non-carbon atoms, e.g., an oxygen atom. The cyclic group may be a cyclic alkenyl group in which the number of carbons may range from, e.g., 2 to 10, 2 to 8, 2 to 6, etc. The cyclic alkenyl group may be unsubstituted or substituted as described with respect to cyclic alkyl groups.

Suitable monofunctional (meth)acrylate monomers including cyclic alkyl groups include tetrahydrofurfuryl methacrylate, tetrahydrofurfuryl acrylate, 3,3,5-trimethylcyclohexyl acrylate, 3,3,5-trimethylcyclohexyl methacrylate, cyclic trimethylolpropane formal (meth)acrylate, and dicyclopentadienyl (meth)acrylate. Such monomers include SR203 (tetrahydrofurfuryl methacrylate), SR285 (tetrahydrofurfuryl acrylate), SR420 (3,3,5-trimethylcyclohexyl acrylate), SR531 (cyclic trimethylolpropane formal acrylate), SR217 (cycloaliphatic acrylate monomer), and SR535 (dicyclopentadienyl methacrylate) available from Arkema, Inc.

In embodiments, the (meth)acrylate monomer does not include any glycol groups. In embodiments, the (meth)acrylate monomer does not include any aryl groups.

In embodiments, the (meth)acrylate monomer has a dynamic viscosity at 25° C. of less than about 100 cps, less than about 80 cps, or less than about 50 cps. In embodiments, the (meth)acrylate monomer has a dynamic viscosity at 25° C. in the range of from about 3 cps to about 50 cps, from about 5 cps to about 30 cps, from about 5 cps to about 15 cps or from about 8 cps to about 15 cps. In embodiments in which the interlayer composition includes more than one type of (meth)acrylate monomer, these dynamic viscosity values may refer to the blend of (meth)acrylate monomers.

In embodiments, the interlayer composition does not contain any multifunctional (meth)acrylate monomers, e.g., di(meth)acrylate monomers. In embodiments, the interlayer composition does not contain any of the following (meth) acrylate monomers: triethylene glycol dimethacrylate, 2-(2-butoxyethoxy)ethyl acrylate, isoctyl acrylate, ethylene glycol dimethacrylate, 1, 3-butylene glycol diacrylate, and diethylene glycol dimethacrylate.

The (meth)acrylate monomer(s) may be provided in the interlayer composition in various suitable amounts. The amount and weight ratio of the polyallyl isocyanurate compound(s) and mercaptoester compound(s) to (meth)acrylate monomer(s) may depend, at least in part, upon the desired viscosity of the interlayer composition, as further described below. In addition, the amount of the (meth)acrylate monomer(s) and/or weight ratio may be sufficiently small so as not to negatively affect curing to form the interlayer film. In embodiments, the (meth)acrylate monomer(s) are present in an amount of from about 5% to about 60% by weight of the interlayer composition, from about 10% to about 40% by weight of the interlayer composition, from about 20% to about 30% by weight of the interlayer composition, from about 15% to about 70% by weight of the interlayer composition, from about 20% to about 60% by weight of the interlayer composition, from about 40% to about 50% by weight of the interlayer composition, or from about 35% to about 45% by weight of the interlayer composition.

Photoinitiator

Particularly if the blend of polyallyl isocyanurate compound(s) and mercaptoester compound(s) does not include a photoinitiator, one may be separately added. A variety of photoinitiators may be used. In embodiments, the interlayer composition contains a single type of photoinitiator. In other embodiments, the interlayer composition contains more than one type of photoinitiator, e.g., two types. The photoinitiator may be selected to have absorbance or an absorbance maximum within a particular range of ultraviolet wavelengths, in embodiments from about 100 nm to about 480 nm, or from about 285 nm to about 480 nm. Suitable photoinitiators include mono-acylphosphine oxide photoinitiators and alpha hydroxy ketone photoinitiators. Suitable photoinitiators include benzoin and benzoin alkyl ethers, such as benzoin, benzil, benzoin methyl ether, benzoin ethyl ether, benzoin n-propyl ether, benzoin n-butyl ether, benzoin isopropyl ether and the like; benzophenones, such as benzophenone, p-methylbenzophenone, Michler's ketone, methylbenzophenone, 4,4'-dichlorobenzophenone, 4,4-bis-diethylaminobenzophenone and the like; acetophenones, such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl [4-(methylthio)phenyl]-2-morpholino-1-propanone, N,N-dimethyl aminoacetophenone and the like; thioxanthone and xanthones, such as 2,4-dimethylthioxanthone, 2,4-diethylthioxanthone, 2-chlorothioxanthone, 2,4-diisopropylthioxanthone, isopropylthioxanthone, and the like; anthraquinones, such as anthraquinone, chloroanthraquinone, 2-methylanthraquinone, 2-ethylanthraquinone, 2-tert-butylanthraquinone, 1-chloroanthraquinone, 2-amylanthraquinone, 2-aminoanthraquinone and the like; ketals, such as acetophenone dimethyl ketal, benzyl dimethyl ketal and the like; benzoic esters, such as ethyl 4-dimethylaminobenzoate, 2-(dimethylamino)ethyl benzoate, ethyl-p-dimethylaminobenzoate and the like; phenyl disulphides, 2-nitrofluorene, butyloin, anisoin ethyl ether, azobisisobutyronitriles, tetramethylthiuram disulphide and the like. Suitable photoinitiators include 2,4,6 Trimethylbenzoyldiphenylphosphine oxide (TPO); bis(2,6-dimethoxybenzoyl)-2,4,4 trimethylpentylphosphine oxide; and the like. The photoinitiators, Irgacure TPO and Irgacure 184, available from BASF, may be used.

The photoinitiator may be provided in the interlayer composition in various suitable amounts. In embodiments, the photoinitiator is present in an amount of from about 0.05% to about 10% by weight of the interlayer composition, from about 0.5% to about 5% by weight of the interlayer composition, or from about 1% to about 3% by weight of the interlayer composition. In embodiments in which more than one type of photoinitiator is used, these amounts may refer to the total amount of photoinitiator in the interlayer composition.

The interlayer composition may include a variety of additional components. In embodiments, the interlayer composition includes a surface leveling agent to adjust the surface tension of the interlayer composition. A variety of surface leveling agents may be used and selected depending upon the choice of the other components of the interlayer composition. Combinations of different types of surface leveling agents may be used. Suitable surface leveling agents include silicone modified polyacrylate, polyester modified polydimethylsiloxane, polyether modified polydimethylsiloxane, polyacrylate modified polydimethylsiloxane, polyester polyether modified polydimethylsiloxane, low molecular weight ethoxylated polydimethylsiloxane, polyester modified polymethylalkylsiloxane, polyether modified polymethylalkylsiloxane, aralkyl modified polymethylalkylsiloxane, polyether modified polymethylalkylsiloxane, and the like.

The surface leveling agent may be a polysiloxane copolymer that includes a polyester modified polydimethylsiloxane, commercially available from BYK Chemical with the trade name of BYK® 310; a polyether modified polydimethylsiloxane, commercially available from BYK Chemical with the trade name of BYK® 330 or commercially available from BYK Chemical with the trade name of BYK® 3510; a polyacrylate modified polydimethylsiloxane, commercially available from BYK Chemical with the trade name of BYK®-SILCLEAN 3700 (about 25 weight percent in methoxypropylacetate); or a polyester polyether modified polydimethylsiloxane, commercially available from BYK Chemical with the trade name of BYK® 375. The surface leveling agent may be a low molecular weight ethoxylated polydimethylsiloxane with the trade name Silsurf® A008 available from Siltech Corporation.

The surface leveling agent may be provided in the interlayer composition in various suitable amounts. In embodiments, the surface leveling agent is present in an amount of from about 0.01% to about 2% by weight of the interlayer composition, from about 0.1% to about 1.5% by weight of the interlayer composition, or from about 0.5% to about 1% by weight of the interlayer composition.

In embodiments, the interlayer composition does not include a solvent, e.g., an organic solvent. This is useful to minimize any undesired solvent-substrate or solvent-conductive ink interactions.

In embodiments, the interlayer composition does not include a polymeric component, e.g., does not include any of the C—C unsaturated polymers (such as the monoalkenyl aromatic diene copolymers, halogen substituted butadienes, acrylonitriles, acrylurethanes, polyvinylpyrolidones, cellulose acetate butyrates, and cellulose acetate succinates) described in U.S. Pat. No. 4,234,676, which is hereby incorporated by reference for its disclosure of C—C unsaturated polymers. In embodiments, the interlayer composition does not include a radiation curable oligomeric component, e.g., does not include any of the radiation curable oligomers (such as the urethane oligomers and the acrylic oligomers) described in U.S. Pat. No. 6,506,814, which is hereby incorporated by reference for its disclosure of radiation curable oligomers. In embodiments, the interlayer composition does not include a mercapto silane compound, an alkanethiol compound, a thioether compound, and/or any of the thiol compounds described in U.S. Pat. No. 6,506,814, which is now incorporated by reference for its disclosure of such thiol compounds.

In embodiments, the interlayer composition consists or consists essentially of a one or more types of polyallyl isocyanurate compounds (e.g., one), one or more types of mercaptoester compounds (e.g., two); one or more types of (meth)acrylate monomers (e.g., one); one or more types of photoinitiators (e.g., one); and optionally one or more types of surface leveling agents. In other embodiments, the interlayer composition consists or consists essentially of one or more types of polyallyl isocyanurate compounds (e.g., one), one or more types of mercaptoester compounds (e.g., two); one or more types of (meth)acrylate monomers (e.g., one); and one or more types of photoinitiators (e.g., one).

The interlayer composition may be characterized by a dynamic viscosity at 25° C. and the dynamic viscosity selected depending upon the type of deposition technique used to deposit the interlayer composition. In embodiments, the interlayer composition is characterized by a dynamic viscosity at 25° C. of less than about 500 cps, less than about 300 cps, or less than about 100 cps. In embodiments, the interlayer composition is characterized by a dynamic viscosity at 25° C. of less than about 16 cps, less than about 12 cps, or less than about 8 cps. In embodiments, the interlayer composition is characterized by a dynamic viscosity at 25° C. in the range of from about 5 cps to about 500 cps, from about 10 cps to about 300 cps, or from about 20 cps to about 200 cps. In embodiments, the interlayer composition is characterized by a dynamic viscosity at 25° C. in the range of from about 2 cps to about 20 cps, from about 2 cps to about 18 cps, from about 5 cps to about 15 cps, or from about 8 cps to about 12 cps. The dynamic viscosity of the interlayer composition may be measured using a commercially available rheometer (e.g., Ares-G2 from TA Instruments).

The interlayer composition may be formed by combining and mixing the selected components at the selected amounts in a suitable container. A suitable method is provided in the Example, below.

Interlayer Film

The interlayer composition may be used to form an interlayer film which can facilitate the deposition and adhesion of other materials, including conductive inks and layers, to an underlying substrate. The interlayer film may be formed by depositing the interlayer composition on or over a substrate and exposing the deposited interlayer composition to ultraviolet (UV) light under conditions sufficient to cure the interlayer composition to form the interlayer film.

The interlayer composition may be deposited onto the substrate by a variety of techniques, including solution-based deposition techniques such as spin coating, dip coating, spray coating, slot die coating, flexographic printing, offset printing, screen printing, gravure printing, ink jet printing/jetting, aerosol jetting and the like. A variety of substrates may be used. Suitable substrates include those composed of silicon, glass, polyester, polycarbonate, polyethylene terephthalate (PET), polyimide, polyethylene naphthalate (PEN), polyether sulfone (PES), acrylonitrile butadiene styrene (ABS), and the like. Fabric and paper substrates may also be used. The material and the thickness of the substrate may be selected such that the substrate has a desired flexibility or rigidity.

The curing conditions include, for example, the wavelength of the UV light, the curing temperature, the curing time (which may be adjusted by the curing speed, e.g., when the source of the UV light is scanned over the deposited interlayer composition), and the curing atmosphere. Various UV wavelengths may be used. In embodiments, the UV wavelength is in the range of from about 100 nm to about 425 nm, in embodiments from about 200 nm to about 410 nm, or in embodiments from about 300 nm to about 410 nm. Any light source providing wavelengths within these ranges may be used, e.g., mercury arc lamps. In embodiments, the curing temperature is room temperature, i.e., from about 20° C. to about 25° C. In embodiments, the curing time is less than about 10 minutes, in embodiments less than about 5 minutes, or in embodiments, less than about 1 minute. This includes embodiments in which the curing time is in the range of about 30 seconds to about 10 minutes. The curing may be performed in an ambient atmosphere (i.e., air at atmospheric pressure).

The cured interlayer composition, i.e., the interlayer film, may be characterized by its average thickness. By "average thickness" it is meant the average value of the thickness of the interlayer film across its surface. In embodiments, the average thickness of the interlayer film is less than about 15 µm, in embodiments less than about 10 µm, in embodiments less than about 5 µm, in embodiments less than about 1 µm, or in embodiments less than about 800 nm. This includes embodiments in which the average thickness of the interlayer film is in the range of from about 200 nm to about 15 µm or from about 800 nm to about 15 µm. Thus, the interlayer films provided by the present disclosure are quite thin. As demonstrated by the Examples below, despite their thinness, the interlayer films that have been formed adhere well to underlying substrates and overlying conductive layers.

The interlayer film may be characterized by its glass transition temperature, $T_g$. In embodiments, the $T_g$ is less than about 100° C., in embodiments less than about 70° C., in embodiments less than about 40° C. This includes embodiments in which the $T_g$ is in the range of from about −10° C. to about 100° C., from about 0° C. to about 50° C., from about 20° C. to about 40° C., or from about 25° C. to about 35° C. The glass transition temperature of the interlayer film may be measured using modulated differential scanning calorimetry on a commercially available differential scanning calorimeter (e.g., Discovery DSC 2500 from TA Instruments).

The interlayer film may be characterized by its Young's modulus at room temperature. In embodiments, the Young's modulus is less than about 1 kgf/mm$^2$, in embodiments less than about 0.8 kgf/mm$^2$, or in embodiments less than about 0.6 kgf/mm$^2$. This includes embodiments in which the Young's modulus is in the range of from about 0.2 kgf/mm$^2$ to about 1 kgf/mm$^2$. The Young's modulus of the interlayer film may be measured by dynamic mechanical analysis. For example, the interlayer film may be cut into a "dog-bone" shaped piece suitable for analysis on a commercially available tensile testing instrument such as an Instron® tensile testing instrument.

The interlayer film may be characterized by its surface free energy at 25° C. In embodiments, the interlayer film has a surface free energy at 25° C. in the range of from about 22 mN/m to around 40 mN/m, in embodiments from about 23 mN/m to about 43 mN/m, in embodiments from about 25 mN/m to about 38 mN/m, or in embodiments from about 28 mN/m to about 35 mN/m. The surface free energy of the interlayer film may be measured using a commercially available tensiometer (e.g., Force Tensiometer K100 from KRUSS GmbH).

The interlayer film may be characterized by its surface roughness, using a suitable surface roughness parameter such as Ra, Rz, Rq, Rsk, and the like. In embodiments, the surface roughness, determined using the surface roughness parameter Ra (see, e.g., U.S. Pat. No. 9,333,742 hereby incorporated by reference in its entirety), is less than about ±10 nm, less than about ±5 nm, or less than about ±2 nm. These values are indicative of a uniform, smooth surface. The surface roughness parameters may be measured by a commercially available profilometer such as a Nanovea® Profilometer.

The interlayer film may be characterized by its instant water contact angle at room temperature. In embodiments, the water contact angle is in the range of from about 45 degrees to about 105 degrees, in embodiments from about 55 degrees to about 95 degrees, or in embodiments from about 65 degrees to about 85 degrees. The instant water contact angle may be measured by a commercially available contact angle analyzer such as FTA Dynamic Contact Angle Analyzer, DAT Instruments USA.

The interlayer film may be characterized by one or more of the properties described above, i.e., one or more of an average thickness, glass transition temperature, Young's modulus, surface free energy, surface roughness, and instant water contact angle. The particular selection of components and relative amounts of such components of the interlayer film may be adjusted to achieve one or more of these properties.

Multilayer Structure

As described above, the interlayer film may be used to facilitate the deposition and adhesion of other materials, including conductive inks and layers, to an underlying substrate. Thus, the interlayer film may be part of a multilayer structure. In embodiments, the multilayer structure includes the substrate, the interlayer film disposed over the surface of the substrate, and a conductive layer disposed over the surface of the interlayer film. In embodiments, the multilayer structure includes the substrate, the interlayer film on (i.e., directly on) the surface of the substrate, and a conductive layer on (i.e., directly on) the surface of the interlayer film. The conductive layer may be formed from a conductive ink. The conductive ink may include a variety of materials, including metal nanoparticles. In embodiments, the metal nanoparticles include silver nanoparticles. Conductive inks including silver nanoparticles such as those disclosed in U.S. Pat. Nos. 8,765,025; 8,361,350; 8,324,294; 8,298,314; 8,158,032; 8,057,849; and 7,270,694 may be used.

After deposition and curing of the interlayer composition to form the interlayer film as described above, the multilayer structure may be formed by depositing the conductive ink on or over the interlayer film. Deposition may be accomplished by a variety of techniques, including solution-based deposition techniques, as described above with respect to the interlayer composition. In embodiments, the deposited conductive ink is subsequently annealed to form the conductive layer. Annealing may be used to provide a conductive layer including sintered metal nanoparticles, e.g., sintered silver nanoparticles. Annealing may be accomplished via a variety of techniques, including, for example, thermal heating, radiation with light (e.g., infrared, microwave, ultraviolet), and the like.

The conductive layer need not fully cover the surface of the underlying interlayer film. For example, depending upon the deposition technique, the conductive layer may include a plurality of conductive features arranged according to a pre-determined pattern or design. Conductive features include, for example, electrodes, pads, interconnects, traces, lines, tracks, and the like. Ink jet printing is a deposition technique that may be used to provide such conductive features.

Additional material layers may be included in the multilayer structure. The multilayer structure may be part of an electronic device (or a component thereof). Electronic devices, include, for example, thin film transistors, light emitting diodes, RFID tags, photovoltaics, displays, printed antenna, and the like.

In embodiments, the interlayer films exhibit excellent wettability for conductive inks (e.g., those containing silver nanoparticles), enabling the printing of fine features. Such features may include lines with sharp edges and uniform widths. In embodiments, the interlayer films enable the printing of a line of conductive ink having a width in the range of from about 10 μm to about 100 μm, from about 50 μm to about 100 μm, or from about 80 μm to about 90 μm. The width of the line may be substantially uniform along the length of the line. By "substantially" it is meant that the width deviates by no more than about ±10%, ±5%, or ±2% along the length of the line. This morphology may be preserved upon annealing the printed conductive ink. In embodiments, the morphology of a conductive layer is substantially same as the morphology of the printed conductive ink prior to annealing. The term "morphology" refers to the shape and dimensions of the conductive layer/printed conductive ink. By "substantially," it is meant that the shape and dimensions are the about same (although they may not be perfectly the same) upon inspection using a camera coupled to a printer used to print the conductive ink.

In embodiments, the interlayer films also provide excellent adhesion of the conductive layers to the underlying substrates (e.g., glass or a flexible polymeric substrate). In embodiments, substantially none of the conductive layer is removed during an adhesion test. An adhesion test is described in the Examples below. By "substantially none," it is meant that no conductive layer is removed under visual inspection or inspection upon using a camera as described above.

EXAMPLES

The following Examples are being submitted to illustrate various embodiments of the present disclosure. These Examples are intended to be illustrative only and are not intended to limit the scope of the present disclosure. Also, parts and percentages are by weight unless otherwise indicated. As used throughout this patent specification, "room temperature" refers to a temperature of from about 20° C. to about 25° C.

Interlayer Compositions

Interlayer compositions were formed by mixing together in a vial 40% by weight of a mercaptoester compound-containing blend (NOA 83H from Norland Products, Inc.) with 60% by weight of one of the (meth)acrylate compounds of Table 1. The vial was placed on a vortex mixer and mixed at a speed of 3000 rpm for 20 seconds. Then, the mixture was roll-milled at 175 rpm for 2 hours.

TABLE 1

(Meth)acrylate component of the Interlayer Compositions.

| Sample | (Meth)acrylate Component | Dynamic Viscosity at 25° C. (cP)[1] | Spin Coating Surface Uniformity | UV Curing Performance |
|---|---|---|---|---|
| 1 | Tetrahydrofurfuryl Methacrylate (SR203) | 5 | Very good | Totally Cured |
| 2 | Tetrahydrofurfuryl Acrylate (SR285) | 6 | Very good | Totally Cured |
| 3 | 3,3,5-Trimethylcyclohexyl Acrylate (SR420) | 6 | Very good | Totally Cured |
| 4 | Triethylene Glycol Dimethacrylate (SR205) | 11 | De-wetting/non-uniform | Not Cured |
| 5 | 2-(2-Butoxyethoxy)ethyl Acrylate (SR278) | 5 | Good | Not Cured |
| 6 | Isoctyl Acrylate (SR440) | 5 | Good | Partially Cured |
| 7 | Ethylene Glycol Dimethacrylate (SR206) | 6 | Good | Not Cured |
| 8 | 1,3-Butylene Glycol Diacrylate (SR212B) | 6 | De-wetting/non-uniform | Partially Cured |
| 9 | Diethylene Glycol Dimethacrylate (SR231) | 8 | Good | Not Cured |

[1]These values refer to the dynamic viscosity of the (meth)acrylate component.

Interlayer Films

The interlayer compositions (Samples 1-9) were deposited onto glass substrates using a SCS P6700 Spin Coater. Samples were spin coated at 1600 rpm for 60 seconds. The uniformity of the surface of the spin coated samples was visually inspected. The results are provided in Table 1. A rating of "very good" indicates completely even coverage and smooth surface. A rating of "de-wetting/non-uniform" indicates that portions of the substrate were uncoated and the thickness of the interlayer composition was uneven across the surface.

The spin coated samples were UV cured using a Fusions UV 600 Lighthammer equipped with a D bulb mercury lamp on a moving track at 32 fpm belt speed. The area of exposure was 12 inches. Thus, the curing time per 12 inches was 1.875 seconds. The curing was conducted at room temperature and in air at atmospheric pressure. To test the curing performance, the surface of the interlayer films was rubbed using a sponge tip wet with isopropyl alcohol and the sponge tip visually evaluated. No marks or smears on the sponge tip indicated total curing. The results of the curing test are also shown in Table 1.

The stability of the interlayer compositions over a period of about a week was also evaluated. Samples 1 and 2 were stable over this time period. However, Sample 3 became cloudy and traces of precipitate were observed over this time period.

Conductive Layers

A conductive ink including silver nanoparticles (15% solids) was printed onto interlayer films formed from two of the interlayer compositions (Samples 1 and 2) using a Dimatix CMP2800 ink jet printer equipped with a 10 pL cartridge. All nozzles worked perfectly, forming spherical drops. Straight lines with uniform, sharp line edges were obtained. The line widths were about 80-90 µm. The printed lines were annealed at 120° C. for 10 minutes. From images taken using the camera of the Dimatix CMP2800 ink jet printer, it was observed that no deformation in line shape, edge sharpness, or line widths was observed after annealing.

The resulting conductive layers (printed, annealed lines) were subjected to an adhesion test by sticking Scotch® Magic™ Tape to the surface of the conductive layers, then peeling the tape off of the surface, and visually evaluating the tape. For comparative samples without any interlayer film, the adhesion of the conductive layers to glass was very poor, resulting in the majority of the conductive layer peeling off the substrate and onto the tapes. For the samples with the interlayer film derived from Samples 1 and 2, the adhesion of the conductive layers was very good, resulting in no conductive layer or interlayer film peeling off the substrate and clear tapes.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A multilayer structure comprising:
    a substrate;
    an interlayer film on the substrate, the interlayer film formed from an interlayer composition consisting essentially of
        one or more types of a polyallyl isocyanurate compound,
        one or more types of an ester of β-mercaptopropionic acid,
        one or more types of a monofunctional (meth)acrylate monomer,
        one or more types of photoinitiators, and
        optionally, one or more types of a surface leveling agent, and
    a conductive layer on the interlayer film, the conductive layer comprising sintered metal nanoparticles.

2. The multilayer structure of claim 1, wherein the interlayer composition does not include a polymeric component or an oligomeric component.

3. The multilayer structure of claim 1, wherein the one or more types of the monofunctional (meth)acrylate monomer is selected from tetrahydrofurfuryl methacrylate, tetrahydrofurfuryl acrylate, 3,3,5-trimethylcyclohexyl acrylate, 3,3,5-trimethylcyclohexyl methacrylate, and combinations thereof.

4. The multilayer structure of claim 1, wherein the one or more types of the polyallyl isocyanurate compound and the one or more types of the ester of β—mercaptopropionic acid are provided in the form of a blend, and the blend is present in an amount of from about 30% to about 85% by weight, the one or more types of the monofunctional (meth)acrylate monomer is present in an amount of from about 15% to about 70% by weight, and the one or more types of the photoinitiator is present in an amount of from about 0.05% to about 10% by weight.

5. The multilayer structure of claim 1, wherein the one or more types of the ester of β-mercaptopropionic acid is selected from an alkyl 3-mercaptopropionate, trimethylolpropane tris(3-mercaptopropionate), pentaerythritol tetrakis(3-mercaptopropionate), ethylene glycol bis(3-mercaptopropionate), dipentaerythritol hexakis(3-mercaptopropionate), and combinations thereof;
 the one or more types of the polyallyl isocyanurate compound is selected from 1,3,5-triallyl-1,3,5-triazine-2,4,6(1H,3H,5H)-trione, 2,4,6-triallyloxy-1,3,5-triazine, and a combination thereof; and
 the one or more types of the monofunctional (meth)acrylate monomer is selected from tetrahydrofurfuryl methacrylate, tetrahydrofurfuryl acrylate, 3,3,5-trimethylcyclohexyl acrylate, 3,3,5-trimethylcyclohexyl methacrylate, cyclic trimethylolpropane formal (meth)acrylate, dicyclopentadienyl (meth)acrylate, and combinations thereof.

6. The multilayer structure of claim 1, wherein the sintered metal nanoparticles comprise sintered silver nanoparticles.

7. The multilayer structure of claim 1, wherein the average thickness of the interlayer film is less than about 15 μm.

8. The multilayer structure of claim 1, wherein the interlayer film exhibits one or more of the following properties: a $T_g$ in the range of from about minus 10° C. to about 100° C.; a Young's modulus at room temperature in the range of from about 0.2 kgf/mm$^2$ to about 1 kgf/mm$^2$; a surface free energy at 25° C. of from about 23 mN/m to about 43 mN/m; and an instant water contact angle at room temperature of from about 45 degrees to about 105 degrees.

9. The multilayer structure of claim 8, wherein the interlayer film exhibits each of the properties.

10. The multilayer structure of claim 1, wherein the monofunctional (meth)acrylate monomer comprises one or more cyclic groups.

11. The multilayer structure of claim 10, wherein the one or more cyclic groups comprise cyclic alkyl groups or cyclic alkenyl groups.

12. The multilayer structure of claim 1, wherein the ester of β-mercaptopropionic acid is selected from an alkyl 3-mercaptopropionate, trimethylolpropane tris(3-mercaptopropionate), pentaerythritol tetrakis(3-mercaptopropionate), ethylene glycol bis(3-mercaptopropionate), dipentaerythritol hexakis(3-mercaptopropionate), and combinations thereof.

13. The multilayer structure of claim 1, wherein the polyallyl isocyanurate compound is selected from triallyl isocyanurate compounds and combinations thereof.

14. The multilayer structure of claim 1, wherein the monofunctional (meth)acrylate monomer is selected from tetrahydrofurfuryl methacrylate, tetrahydrofurfuryl acrylate, 3,3,5-trimethylcyclohexyl acrylate, 3,3,5-trimethylcyclohexyl methacrylate, cyclic trimethylolpropane formal (meth)acrylate, dicyclopentadienyl (meth)acrylate, and combinations thereof.

15. The multilayer structure of claim 1, wherein the one or more types of the polyallyl isocyanurate compound and the one or more types of the ester of β—mercaptopropionic acid are provided in the form of a blend, and the blend is present in an amount of from about 30% to about 85% by weight, the one or more types of the monofunctional (meth)acrylate monomer is present in an amount of from about 15% to about 70% by weight, and the one or more types of the photoinitiator is present in an amount of from about 0.05% to about 10% by weight,
 and further wherein the one or more types of the ester of β-mercaptopropionic acid is selected from an alkyl 3-mercaptopropionate, trimethylolpropane tris(3-mercaptopropionate), pentaerythritol tetrakis(3-mercaptopropionate), ethylene glycol bis(3-mercaptopropionate), dipentaerythritol hexakis(3-mercaptopropionate), and combinations thereof;
 the one or more types of the polyallyl isocyanurate compound is selected from 1,3,5-triallyl-1,3,5-triazine-2,4,6(1H,3H,5H)-trione, 2,4,6-triallyloxy-1,3,5-triazine, and a combination thereof; and
 the one or more types of the monofunctional (meth)acrylate monomer is selected from tetrahydrofurfuryl methacrylate, tetrahydrofurfuryl acrylate, 3,3,5-trimethylcyclohexyl acrylate, 3,3,5-trimethylcyclohexyl methacrylate, cyclic trimethylolpropane formal (meth)acrylate, dicyclopentadienyl (meth)acrylate, and combinations thereof.

16. A process for forming a multilayer structure, the process comprising:
 depositing a UV-curable interlayer composition on a substrate, the interlayer composition consisting essentially of
  one or more types of a polyallyl isocyanurate compound,
  one or more types of an ester of β-mercaptopropionic acid,
  one or more types of a monofunctional (meth)acrylate monomer,
  one or more types of photoinitiators, and
  optionally, one or more types of a surface leveling agent, and
 exposing the deposited interlayer composition to UV light under conditions sufficient to cure the interlayer composition to form a cured interlayer film;
 depositing a conductive composition comprising metal nanoparticles on the cured interlayer film; and
 annealing the conductive composition to produce a conductive layer comprising sintered metal nanoparticles.

17. The process of claim 16, wherein the interlayer composition is deposited at room temperature and in an ambient atmosphere.

* * * * *